US010949268B2

(12) United States Patent
Kim

(10) Patent No.: US 10,949,268 B2
(45) Date of Patent: Mar. 16, 2021

(54) METHOD FOR PROVIDING TELEMATICS SERVICE USING VIRTUAL VEHICLE AND TELEMATICS SERVER USING THE SAME

(71) Applicant: Jet Bridge LLC, Novi, MI (US)

(72) Inventor: Jay Kim, Novi, MI (US)

(73) Assignee: Jet Bridge LLC, Novi, MI (US)

( * ) Notice: Subject to any disclaimer, the term of this patent is extended or adjusted under 35 U.S.C. 154(b) by 57 days.

(21) Appl. No.: 16/569,018

(22) Filed: Sep. 12, 2019

(65) Prior Publication Data

US 2020/0004605 A1    Jan. 2, 2020

Related U.S. Application Data

(63) Continuation of application No. 15/672,012, filed on Aug. 8, 2017, now abandoned.

(51) Int. Cl.
*G06F 9/54* (2006.01)
*B60R 16/02* (2006.01)
*G06F 30/20* (2020.01)
*G07C 5/00* (2006.01)
*G06F 30/15* (2020.01)
*H04L 29/08* (2006.01)

(52) U.S. Cl.
CPC .............. *G06F 9/541* (2013.01); *B60R 16/02* (2013.01); *G06F 30/20* (2020.01); *G06F 30/15* (2020.01); *G07C 5/008* (2013.01); *H04L 29/08666* (2013.01)

(58) Field of Classification Search
None
See application file for complete search history.

(56) References Cited

U.S. PATENT DOCUMENTS

| 6,728,612 | B1 | 4/2004 | Carver et al. |
| 2004/0185842 | A1 | 9/2004 | Spaur et al. |
| 2008/0147245 | A1 | 6/2008 | Koepf et al. |
| 2013/0167119 | A1 | 6/2013 | Lee et al. |
| 2016/0283361 | A1 | 9/2016 | Alexander et al. |
| 2017/0178419 | A1 | 6/2017 | Paridel et al. |
| 2018/0060456 | A1 | 3/2018 | Phatak et al. |

*Primary Examiner* — Shih-Wei Kraft
(74) *Attorney, Agent, or Firm* — Husch Blackwell LLP

(57) ABSTRACT

A method for providing a telematics service by using a virtual vehicle is provided. The method includes steps of: (a) a telematics server, if a request for registering the vehicle is acquired from a third-party system linked with the telematics service, creating a vehicle ID, and providing a telematics API to the third-party system; (b) the telematics server, if a request is received from the third-party system, creating a token ID corresponding to the system by referring to information on the system and the vehicle ID, and then transmitting it to the system; and (c) the telematics server, if a telematics service request using the token ID is transmitted from the system through the telematics API, confirming the vehicle ID corresponding to the token ID, simulating the virtual vehicle in response to the service request, and transmitting the simulation result to the third-party system.

10 Claims, 4 Drawing Sheets

METHOD FOR PROVIDING TELEMATICS SERVICE USING VIRTUAL VEHICLE AND TELEMATICS SERVER USING THE SAME

CROSS-REFERENCE TO RELATED APPLICATIONS

This Application is a continuation of U.S. application Ser. No. 15/672,012 filed on Aug. 8, 2017 which is hereby incorporated in its entirety by reference.

FIELD OF THE INVENTION

The present invention relates to a method for providing a telematics service using a virtual vehicle and a telematics server using the same, and more particularly, to the method for providing the telematics service using the virtual vehicle by creating a virtual vehicle ID in response to a request for registering the virtual vehicle from a third-party service-providing system that provides the third-party service linked with the telematics service, providing the third-party service-providing system with a telematics API corresponding to the virtual vehicle, creating a token ID corresponding to the third-party service-providing system by referring to information on the third-party service-providing system and the virtual vehicle ID in response to a link establishing request from the third-party service-providing system, confirming the virtual vehicle ID corresponding to the token ID in response to a telematics service request through the telematics API, simulating the virtual vehicle corresponding to the virtual vehicle ID, and transmitting a result of the simulation to the third-party service-providing system and the telematics server using the same.

BACKGROUND OF THE INVENTION

In general, a term "telematics" is a compound derived from telecommunication and informatics. Drivers may remotely diagnose their vehicles through a wireless network and use a variety of information including traffic, living, and emergency rescue information. They may make calls, or send and receive emails by voice, and also download audiobooks.

In addition, a variety of telematics services are available depending on types of services including news subscription, stock investment, e-commerce, financial transactions, hotel reservations, facsimile transmission and reception, video games, car accident and theft reports, etc.

At earlier stages, such telematics services were provided based on call centers, but they have emerged as mobile app-based telematics services according to increase of mobile users.

Recently, methods for easily connecting third-party services with vehicle telematics services, for testing operations in vehicles before release of the vehicles, and for effectively managing the third-party services after the release came to be in demand to solve various problems due to a difference between a short development time of software services and a long time of manufacturing vehicles under environments such as a variety of cloud-based services, partnerships with third partners, IoT integration, mobile services, etc. In addition, flexible service structures also became necessary to provide the third-party services by region by considering various new vehicles and launching the third-party services.

However, in case of conventional telematics services, because third-party services to be connected with actual vehicles are limited before the release of new vehicles or service launching, third-party service providers have limited ways of developing and verifying applications by using the telematics services.

In addition, the telematics service providers have security issues because they have to open up specifications of the telematics services for linking their services with the third-party services.

Besides, the conventional telematics services have limitations in providing multiple users with the telematics service through the third-party services because vehicle access control, user management, device management, and authority management have not been developed in view of multiple devices or multiple users.

In addition, it is difficult for third-party service developers to develop their services linked with the telematics services because they do not have a means for testing their services before actual applications are properly configured.

SUMMARY OF THE INVENTION

It is an object of the present invention to solve all the aforementioned problems.

It is another object of the present invention to facilitate developing and verifying a third-party service linked with a telematics service before a release of an actual vehicle or before launching of the third-party service.

It is still another object of the present invention to allow third-party service developers to use the telematics service without a specification of the telematics service being opened up.

It is still yet another object of the present invention to provide the telematics service to multiple users through the third-party service.

It is still yet another object of the present invention to allow the third-party service developers to test the third-party service by linking it with the telematics service.

In accordance with one aspect of the present invention, there is provided a method for providing a telematics service by using a virtual vehicle, including steps of: (a) a telematics server, if a request for registering the virtual vehicle is acquired from a third-party service-providing system that provides a third-party service linked with the telematics service, creating a virtual vehicle ID corresponding to the virtual vehicle, and providing a telematics API corresponding to the virtual vehicle to the third-party service-providing system; (b) the telematics server, if a link establishing request is received from the third-party service-providing system, creating a token ID corresponding to the third-party service-providing system by referring to information on the third-party service-providing system and the virtual vehicle ID, and then transmitting it to the third-party service-providing system; and (c) the telematics server, if a telematics service request making use of the token ID is transmitted from the third-party service-providing system through the telematics API, confirming the virtual vehicle ID corresponding to the token ID, simulating the virtual vehicle corresponding to the virtual vehicle ID in response to the telematics service request, and transmitting a result of the simulation to the third-party service-providing system.

In accordance with another aspect of the present invention, there is provided a method for providing a telematics service by using a virtual vehicle, including steps of: (a) a telematics server, on condition that (i) a virtual vehicle ID corresponding to the virtual vehicle is created in response to a request for registering the virtual vehicle from a third-party service-providing system and (ii) a first token ID corresponding to a user is created by referring to the user's information and the virtual vehicle ID in response to a link establishing request from the third-party service-providing system and the created first token ID is transmitted to the third-party service-providing system, if a request for linking an actual vehicle of the user of the telematics service with the virtual vehicle is acquired from the third-party service-providing system, linking an actual vehicle ID of the user's actual vehicle and the virtual vehicle ID, creating a second token ID corresponding to the user by referring to the user's information and link information on linkage of the actual vehicle ID and the virtual vehicle ID, and transmitting the created second token ID to the third-party service-providing system; and (b) the telematics server, if a telematics service request requested by the user and the second token ID are acquired from the third-party service-providing system, confirming the user's actual vehicle as a subject to be controlled in response to the telematics service request by referring to the second token ID and supporting a telematics device placed in the confirmed actual vehicle to execute a telematics API in response to the telematics service request.

In accordance with still another aspect of the present invention, there is provided a telematics server for providing a telematics service by using a virtual vehicle, including: a communication part for acquiring a request for registering the virtual vehicle from a third-party service-providing system that provides a third-party service linked with the telematics service; and a processor for creating a virtual vehicle ID corresponding to the virtual vehicle, providing a telematics API corresponding to the virtual vehicle to the third-party service-providing system, creating a token ID corresponding to the third-party service-providing system in response to the request for registering the virtual vehicle by refer-ring to information on the third-party service-providing system and the virtual vehicle ID, transmitting it to the third-party service-providing system, confirming the virtual vehicle ID corresponding to the token ID, simulating the virtual vehicle corresponding to the virtual vehicle ID in response to the telematics service request corresponding to a telematics service request making use of the token ID from the third-party service-providing sys-tem through the telematics API, and transmitting a result of the simulation to the third-party service-providing system.

In accordance with still yet another aspect of the present invention, there is provided a telematics server for providing a telematics service by using a virtual vehicle, including: a communication part for, on condition that (i) a virtual vehicle ID corresponding to the virtual vehicle is created in response to a request for registering the virtual vehicle from a third-party service-providing system and (ii) a first token ID corresponding to a user is created by referring to the user's information and the virtual vehicle ID in response to a link establishing request from the third-party service-providing system and the created first token ID is transmitted to the third-party service-providing system, acquiring a request for linking an actual vehicle of the user of the telematics service with the virtual vehicle from the third-party service-providing system; and a processor for linking an actual vehicle ID of the user's actual vehicle and the virtual vehicle ID in response to the link establishing request, creating a second token ID corresponding to the user by referring to the user's information and link information on linkage of the actual vehicle ID, and the virtual vehicle ID, transmitting the created second token ID to the third-party service-providing system, confirming the user's actual vehicle as a subject to be controlled in response to the telematics service request, if a telematics service request requested by the user and the second token ID are acquired from the third-party service-providing system, by referring to the second token ID and supporting a telematics device placed in the confirmed actual vehicle to execute a telematics API in response to the telematics service request.

BRIEF DESCRIPTION OF THE DRAWINGS

The drawings attached below to explain example embodiments of the present invention are only part of example embodiments of the present invention and other drawings may be obtained based on the drawings without inventive work for those skilled in the art.

DETAILED DESCRIPTION OF THE PREFERRED EMBODIMENTS

Figure 1:
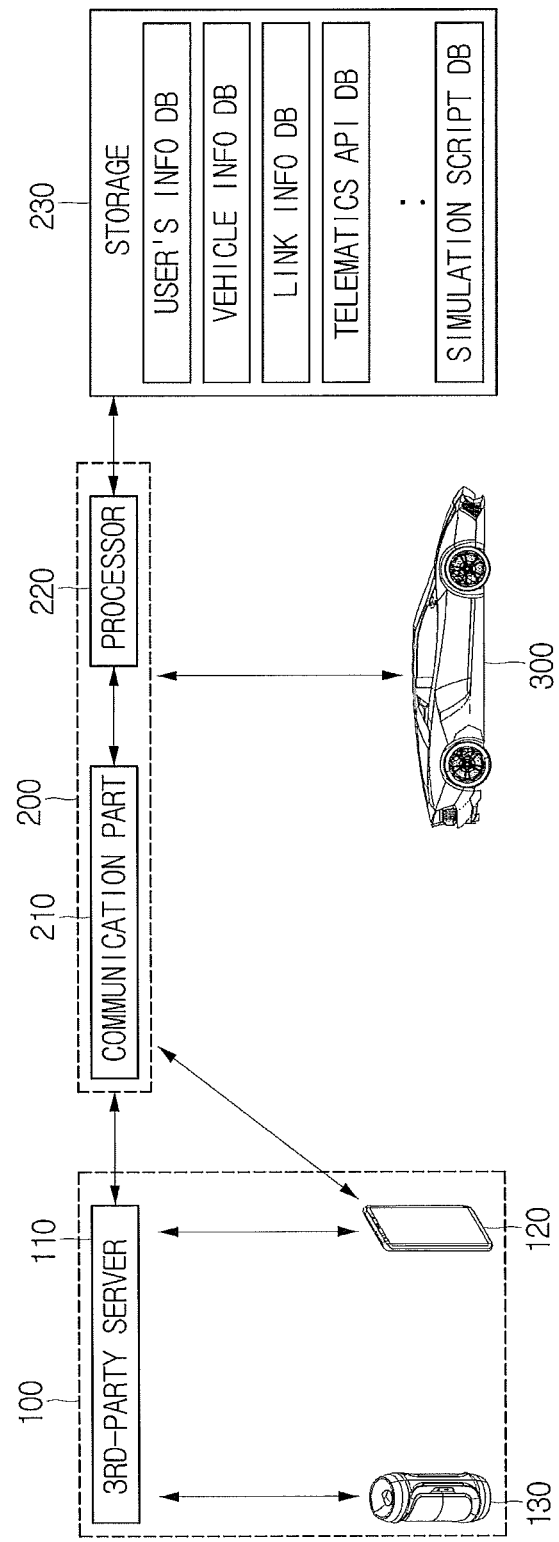
FIG. 1 schematically illustrates a system for providing a telematics service by using a virtual vehicle in accordance with one example embodiment of the present invention.

Detailed explanations of the present invention explained below refer to attached drawings that illustrate specific embodiment examples of this present that may be executed. These embodiments are described in sufficient detail to enable those skilled in the art to practice the invention. It is to be understood that the various embodiments of the present invention, although different, are not necessarily mutually exclusive. For example, a particular feature, structure, or characteristic described herein in connection with one embodiment may be implemented within other embodiments without departing from the spirit and scope of the present invention. In addition, it is to be understood that the position or arrangement of individual elements within each disclosed embodiment may be modified without departing from the spirit and scope of the present invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

To make those skilled in the art embody the present invention easily, desirable example embodiments of the present invention will be explained more specifically by referring to drawings attached.

FIG. 1 roughly illustrates a whole system for providing a telematics service by using a virtual vehicle in accordance with one example embodiment of the present invention. The whole system may include a third-party service-providing system 100, and a telematics server 200.

First of all, the third-party service-providing system 100 may provide a third-party service linked with the telematics service. It provides a cloud service, an IoT service, a mobile service, etc. by linking with the telematics service.

Herein, the third-party service-providing system 100 may include a user device 120, a third-party server 110, etc.

The user device 120 may include a desktop computer, a laptop computer, a tablet PC, a PDA, a smartphone, a portable device, etc. and it may not be limited to them. It may include all computing devices which display information transmitted through communication with other devices and transmit a data signal corresponding to a user's input signal to other devices.

The third-party server 110 may support the telematics server to provide the telematics service by creating a telematics service request corresponding to a third-party service request received from the user device 120 and transmitting it to the telematics server. Herein, the third-party server 110 may be a server that achieves a desired system performance by using a combination of a computing device and computer software.

In addition, the third-party service-providing system 100 may include a third-party unit 130.

Herein, the third-party unit 130 provides the user with the third-party service by linking with the third-party server 110.

Next, the telematics server 200 typically achieves desired system performance by using combinations of a computing device, e.g., a computer processor, a memory, a storage, an input device, an output device, and other devices that may include components of conventional computing devices; an electronic communication device such as a router or a switch; an electronic information storage system such as a network-attached storage (NAS) device and a storage area network (SAN); and computer software, i.e., instructions that allow a computing device to function in a specific way; and provides the telematics service requested from the third-party service-providing system 100.

Herein, the telematics server 200 may include a communication part 210, a processor 220, and a storage 230. However, the storage 230 may not have to be included in the telematics server 200. For convenience, FIG. 1 illustrates the storage 230 placed outside the telematics server 200.

As such, the communication part 210 of the telematics server 200 may transmit requests and receive responses with other linked devices. As one example, such requests and responses may be carried out by the same TCP session, but they are not limited to these. For example, they could be transmitted and received as UDP datagrams.

In addition, the processor 220 of the telematics server 200 may include a configuration of hardware including a micro processing unit (MPU), central processing unit (CPU), cache memory, data bus, etc. Besides, a configuration of software such as an operating system and applications which perform specific purposes could be further included.

The processor 220 of the telematics server 200 may allow the telematics service desired by the user to be performed by supporting a telematics device 300 of the vehicle to run a telematics API in response to the telematics service request from the third-party service-providing system 100.

In addition to this, the processor 220 of the telematics server 200 may create a virtual vehicle ID in response to a request for registering the virtual vehicle from the third-party service-providing system 100 and support the third-party service-providing system 100 to simulate the third-party service linked with the telematics service by using the virtual vehicle.

Furthermore, the storage 230 of the telematics server 200 may store a program, data required for operation of the processor 220, or data created by the operation, etc. Herein, the storage 230 may be embedded in the telematics server 200 or detachable. The storage 230 may also transmit and receive data through communication with the telematics server 200, installed outside the telematics server 200.

Moreover, the storage 230 may include a flash memory, a hard disk, a memory card such as an SD memory card or an XD memory card, a random access memory (RAM), a static random access memory (SRAM), a read only memory (ROM), an electrically erasable programmable read only memory (EEPROM), a programmable read only memory (PROM), a magnetic memory, a magnetic disk, an optical disk, etc. In addition, the storage 230 may be formed as a single medium or as multiple media.

At this time, the storage 230 may store user's information, vehicle information, link information, telematics API, simulation scripts, etc. and may be formed as a single or multiple database servers that store the information.

By referring to FIGS. 2 to 4, explanation on a method for providing the telematics service by using the virtual vehicle in accordance with one example embodiment of the present invention configured as such will be made as follows:

First of all, by referring to FIG. 2, a course of registering the virtual vehicle to use the telematics service in accordance with one example embodiment of the present invention will be explained as shown below.

To simulate whether the third-party service linked with the telematics service is operable without an actual vehicle, the third-party service-providing system sends a request for registering the virtual vehicle to the telematics server 200 at the step of S1. At this time, if the third-party service-providing system 100 includes the third-party server 110 and the user device 120, the request for registering the virtual vehicle may be transmitted from the user device 120 to the telematics server 200, or the request for registering the virtual vehicle may be transmitted from the user device 120 to the telematics server 200 via the third-party server 110.

Then, the telematics server 200 creates the virtual vehicle ID corresponding to the request for registering the virtual vehicle acquired from the third-party service-providing system 100, e.g., the third-party server 110 or the user device 120, at the step of S2. At this time, the telematics server 200 may register the created virtual vehicle ID in a database of vehicle information. Besides, information on an account corresponding to the virtual vehicle ID, i.e., information of the third-party service-providing system 100, may be registered in a database of user's information.

In addition, the telematics server 200 provides the third-party service-providing system 100 with the telematics API which allows an access to the telematics service through the virtual vehicle, at the step of S3. At this time, if the third-party service-providing system 100 includes the third-party server 110 and the user device 120, the telematics server 200 may provide at least one of the third-party server 110 and the user device 120 with the telematics API. However, the drawings are illustrated on the assumption that the telematics server 200 provides the telematics API to the third-party server 110. For reference, the telematics server 200 may acquire the telematics API from a database of telematics APIs and transmit the acquired telematics API to the third-party service-providing system 100.

After that, the third-party service-providing system 100 transmits a link establishing request to the telematics server 200 to link a third-party service account and a telematics service account, at the step of S4.

Then, the telematics server 200 links the third-party service account and the telematics service account in response to the link establishing request, and creates a token ID corresponding to the third-party service-providing system 100 by referring to information of the third-party service-providing system 100 and the virtual vehicle ID at the step of S5, and transmits the created token ID to the third-party service-providing system 100 at the step of S6. At this time, if the third-party service-providing system 100 includes the user device 120 and the third-party server 110, the telematics server 200 may create the token ID by referring to information on the user corresponding to the user device 120 and the virtual vehicle ID, transmit the created token ID to the third-party server 110, and transmit information on creation of the token ID to the user device 120.

Moreover, the telematics server 200 stores the link information corresponding to the creation of the token ID in the storage 230, e.g., a database of link information.

In addition to this, the third-party service-providing system 100 may further include the third-party unit 130 which provides the third-party service to the user by linking with the third-party server 110.

Herein, the third-party unit 130 may include a microphone, etc. for the user's voice input, and, as the case may be, the microphone and a speaker, if the third-party service-providing system 100 includes a voice recognition service-providing device.

To use the third-party unit 130, if a request for registering the third-party unit 130 by the user is transmitted from the user device 120 or the third-party server 110, the telematics server 200 may register and manage information on the third-party unit 130 to be corresponding to the user's information and the virtual vehicle ID.

At this time, the telematics server 200 may limit the number of third-party units 130 to be registered to a pre-specified value and may manage them by acquiring information on locations of the individual registered third-party units 130.

Through these, the telematics server 200 may control an authority to access the telematics service making use of the third-party units 130 used by the user, and improve security of the telematics service against theft or fraudulent use by referring to the information on the locations of the third-party units 130.

Figure 2:
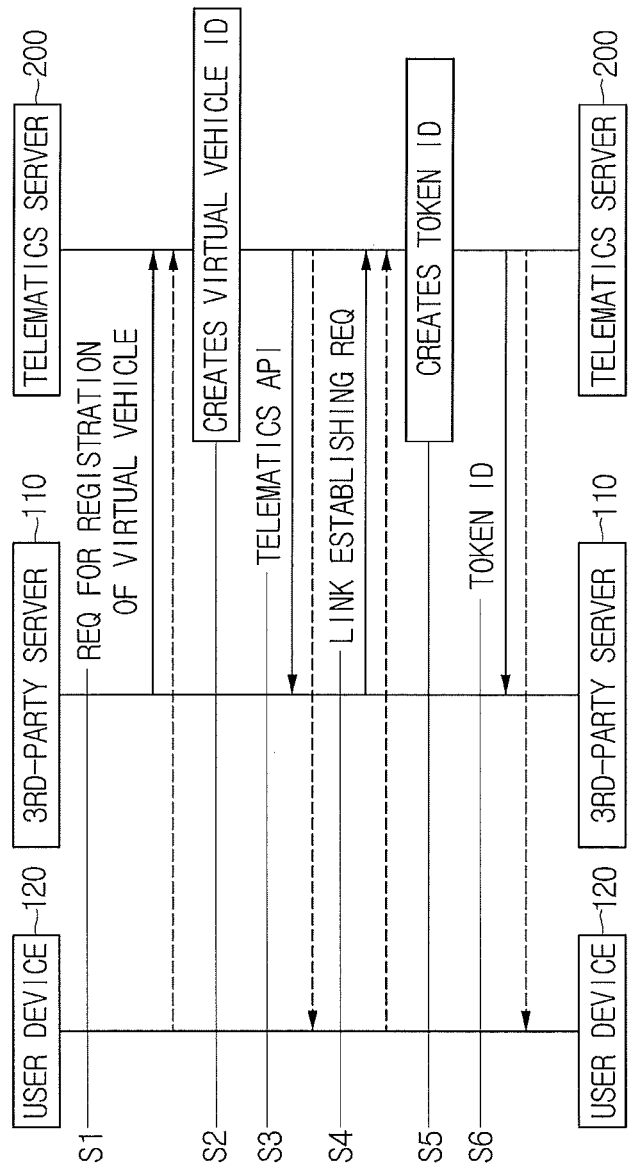
FIG. 2 schematically illustrates a course of registering the virtual vehicle to use the telematics service in accordance with one example embodiment of the present invention.

On condition that the virtual vehicle is registered under the method as shown in FIG. 2, a method for providing the telematics service by using the virtual vehicle in accordance with one example embodiment of the present invention is explained as shown below by referring to FIG. 3.

A telematics service request is transmitted from the third-party service-providing system 100 through the telematics API to the telematics server 200. For example, if the user transmits a third-party service request to the third-party server 110 by using the user device 120 or the third-party unit 130 at the step of S11, the third-party server 110 executes the telematics API corresponding to the telematics service request to thereby allow the telematics service request through the telematics API to be transmitted to the telematics server 200 at the step of S12.

Then, the telematics server 200 confirms a linked vehicle ID by referring to the token ID in response to the telematics service request acquired from the third-party service-providing system 100 at the step of S13. As one example, the telematics server 200 confirms the vehicle ID in the database of vehicle information by referring to the token ID.

At this time, if the confirmed vehicle ID is an actual vehicle ID corresponding to the actual vehicle at the step of S14, the telematics server 200 supports the telematics device 300 to control the vehicle as requested by the user, by transmitting an API executing command signal corresponding to the telematics service requested by the user to the telematics device 300 placed in the actual vehicle corresponding to the token ID at the step of S15.

If information on an API result as a result of executing the API is received from the telematics device 300 of the vehicle at the step of S16, the telematics server 200 registers the information on the API result with, e.g., the database of vehicle information at the step of S17 and transmits it to the third-party service-providing system 100, e.g., at least one of the user device 120 and the third-party server 110, at the step of S18.

On the other hand, if the vehicle ID corresponding to the confirmed token ID is determined to be the virtual vehicle ID corresponding to the virtual vehicle at the step of S19, the telematics server 200 simulates the telematics service by using the virtual vehicle corresponding to the virtual vehicle ID in response to the telematics service request from the third-party service-providing system 100 and transmits a result of the simulated telematics service to the third-party service-providing system 100.

For example, the telematics server 200 confirms the vehicle ID corresponding to the token ID and if the vehicle ID is determined to be the virtual vehicle ID at the step of S19, the telematics server 200 converts the telematics service request received from the third-party service-providing system 100 into a simulation command signal at the step of S20.

The telematics server 200 simulates the virtual vehicle by executing a simulation script corresponding to the simulation command signal, at the step of S21. At this time, the telematics server 200 acquires the simulation script corresponding to the simulation command signal from a database of simulation scripts and simulates the virtual vehicle in response to the simulation command signal making use of the acquired simulation script.

Thereafter, the telematics server 200 acquires information on a result of simulation of the virtual vehicle making use of the simulation script at the step of S22, and registers the information on the acquired simulation at the step of S23. For example, the telematics server 200 registers the information on the result of the simulation to the information on the virtual vehicle in a database of vehicle information.

After converting the information on the result of the simulation into that conforming to a result from the telematics API at the step of S24, the telematics server 200 transmits the converted information to the third-party service-providing system 100, e.g., at least one of the user device 120 and the third-party server 110, at the step of S25.

In the aforementioned, before the simulation script is executed, the telematics server 200 confirms a latest status of the virtual vehicle by referring to information on the registered virtual vehicle corresponding to the virtual vehicle ID, executes the simulation script by using the virtual vehicle with the confirmed latest status, and updates the latest status of the virtual vehicle by registering information on the result of the simulation to the information on the virtual vehicle.

Following such operations, the third-party service-providing system 100 may simulate whether the third-party service linked with the telematics service properly operates, under the telematics service corresponding to the actual vehicle.

Figure 3:
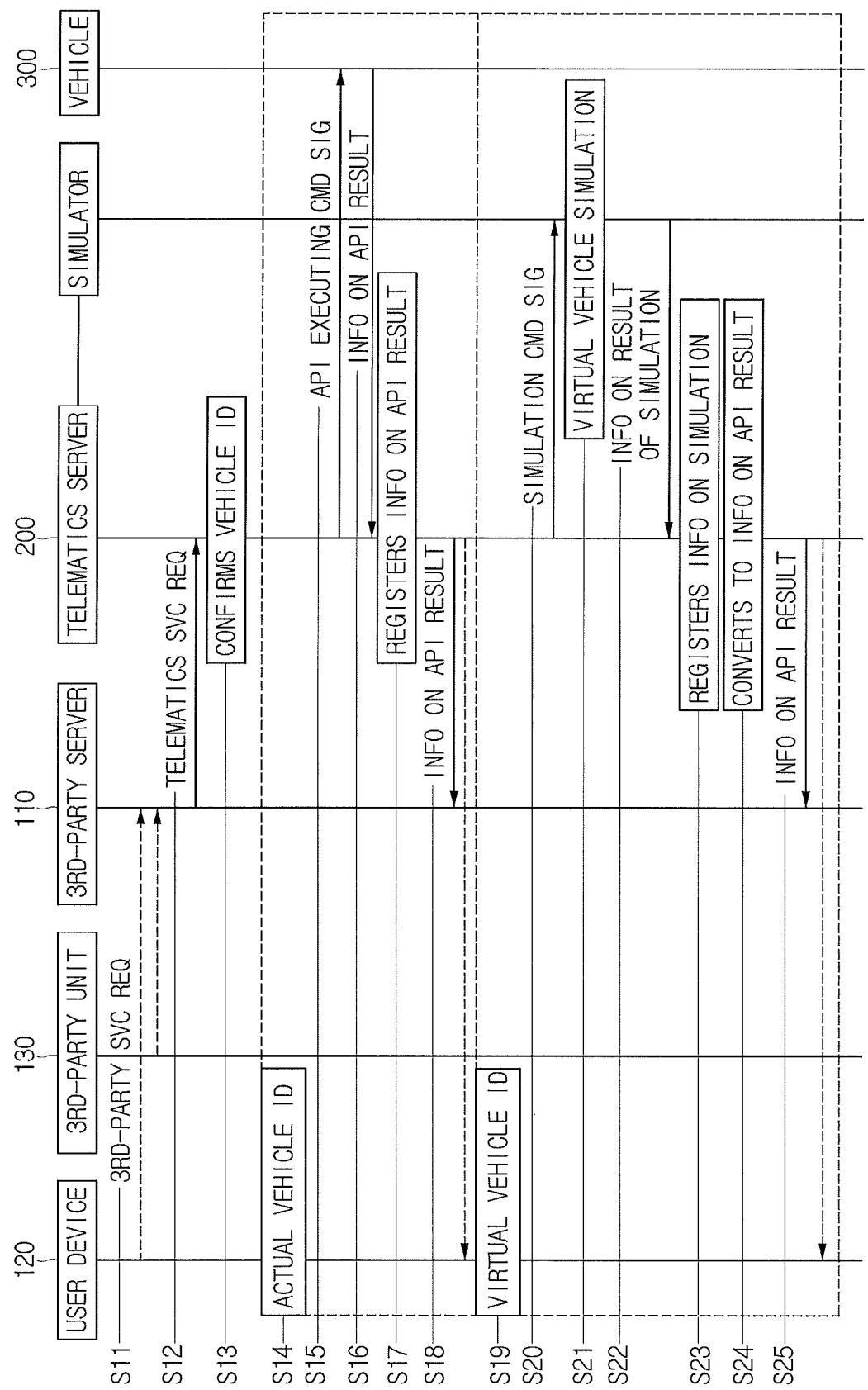
FIG. 3 schematically illustrates a method for providing the telematics service by using the virtual vehicle in accordance with one example embodiment of the present invention.
Figure 4:
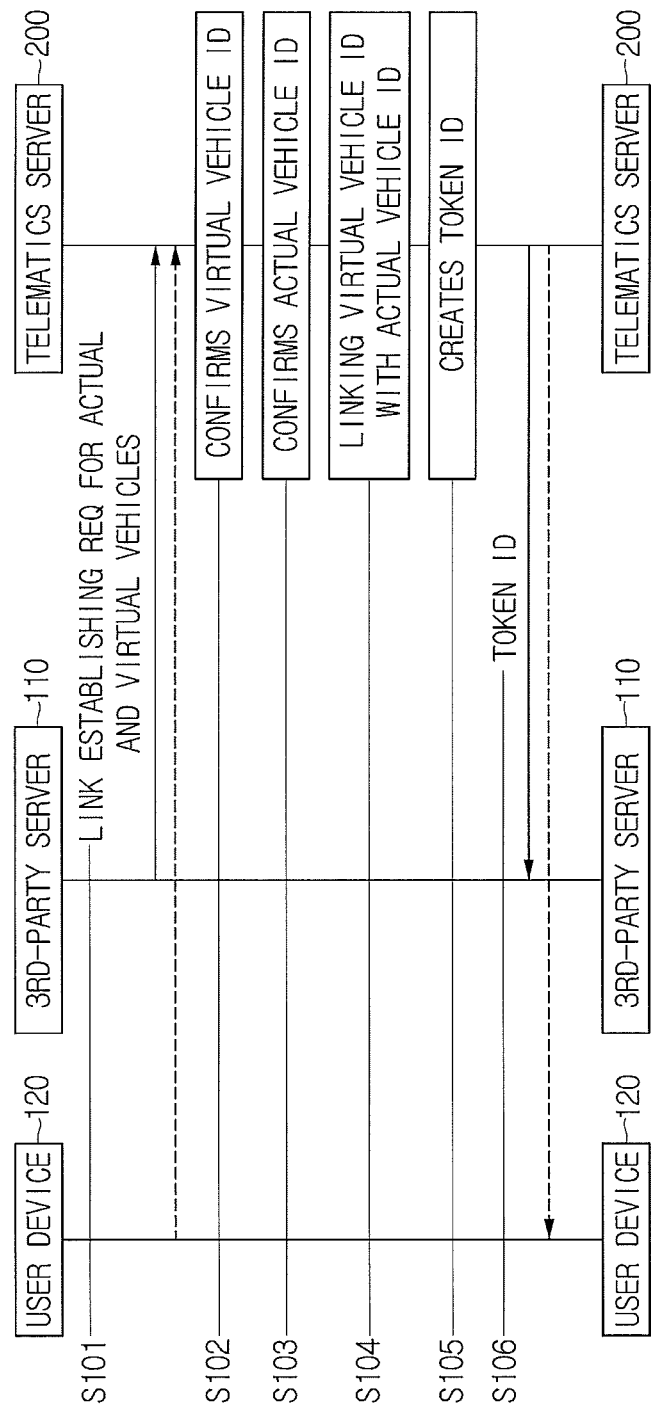
FIG. 4 schematically illustrates a course of linking the virtual vehicle with an actual vehicle in accordance with one example embodiment of the present invention.

Next, a course of linking the virtual vehicle with the actual vehicle in accordance with one example embodiment of the present invention will be explained by referring to FIG. 4 as follows:

To link the virtual vehicle with the actual vehicle in a variety of situations under the method as specified in FIG. 3 including, but not limited to, a case that a user, who has experienced or used the telematics service by using a virtual vehicle without his or her actual vehicle, intends to use the telematics service by using his or her actual vehicle; a case that the user, who does not have an actual vehicle, intends to use an actual vehicle that has been already utilizing the telematics service; or a case that the user intends to apply the telematics service tested by a simulation using the virtual vehicle to an actual vehicle; if a link establishing request for the actual vehicle and the virtual vehicle is acquired from the third-party service-providing system 100, e.g., the user device 120 or the third-party server 110, at the step of S101, the telematics server 200 confirms the virtual vehicle ID and the actual vehicle ID at the steps of S102 and S103.

In other words, on condition that (i) a virtual vehicle ID corresponding to the virtual vehicle is created in response to a request for registering the virtual vehicle from the third-party service-providing system 100 and (ii) a first token ID corresponding to a user is created by referring to the user's information and the virtual vehicle ID in response to the link establishing request for linking the user with the virtual vehicle from the third-party service-providing system 100 and the created first token ID is transmitted to the third-party service-providing system 100; if a request for linking the actual vehicle with the virtual vehicle is acquired from the third-party service-providing system 100 at the step of S101, the telematics server 200 confirms the virtual vehicle ID and the actual vehicle ID at the steps of S102 and S103.

Then, the telematics server 200 links the actual vehicle ID of the user's actual vehicle and the virtual vehicle ID at the step of S104, creates a second token ID corresponding to the user by referring to the user's information and link information on linkage of the actual vehicle ID and the virtual vehicle ID at the step of S105, and transmits the created second token ID to the third-party service-providing system 100.

Accordingly, the user who has been using the virtual vehicle ID may continuously use the telematics service with the actual vehicle by linking the virtual vehicle ID with the actual vehicle ID.

Herein, the telematics server 200 sets and manages an authority to access the telematics service making use of the second token ID according to at least one set condition, e.g., a telematics service usage condition for the actual vehicle, transmitted from the third-party service-providing system 100. The set condition may include the number of times of use, a location of use, time of use, etc., but it is not limited to these and it may include all conditions for entrusting some of the authority to utilize the telematics service to other users.

Through this, the user who has the actual vehicle may allow a third-party without an actual vehicle to utilize the user's vehicle through the telematics service.

Thereafter, if the telematics service request by the user and the second token ID are acquired from the third-party service-providing system 100, the telematics server 200 confirms the actual vehicle ID to be controlled in response to the telematics service request by referring to the second token ID. Because the vehicle ID being confirmed is the actual vehicle ID, the telematics server 200 supports the telematics device placed in the actual vehicle of the user to execute the telematics API corresponding to the telematics service request to thereby control the vehicle as intended by the user.

In accordance with the present invention, a third-party service developer may utilize the telematics service by using the virtual vehicle ID to test the third-party service linked with the telematics service even before a configuration of the actual application is completed, and therefore, it may be easier to develop the third-party service.

In accordance with the present invention, the third-party service developer may utilize the telematics service by using the virtual vehicle to verify the third-party service linked with the telematics service even before the release of the actual vehicle, and therefore, it may shorten a time of developing the third-party service.

In accordance with the present invention, even before the release of the actual vehicle, as the telematics service can be utilized by using the virtual vehicle ID, the telematics service provider does not have to open up the specification of the telematics service to link with the third-party service, and therefore, the security of the telematics service may be improved.

Besides, as it is possible to use a telematics service by using a virtual vehicle, the present invention is useful in providing the telematics service to multiple users.

The embodiments of the present invention as explained above can be implemented in a form of executable program command through a variety of computer means recordable to computer readable media. The computer readable media may include solely or in combination, program commands, data files, and data structures. The program commands recorded to the media may be components specially designed for the present invention or may be usable to a skilled person in a field of computer software. Computer readable record media include magnetic media such as hard disk, floppy disk, and magnetic tape, optical media such as CD-ROM and DVD, magneto-optical media such as floptical disk and hardware devices such as ROM, RAM, and flash memory specially designed to store and carry out programs. Program commands include not only a machine language code made by a complier but also a high-level code that can be used by an interpreter etc., which is executed by a computer. The aforementioned hardware devices can work as more than a software module to perform the action of the present invention and they can do the same in the opposite case.

As seen above, the present invention has been explained by specific matters such as detailed components, limited embodiments, and drawings. While the invention has been shown and described with respect to the preferred embodiments, it, however, will be understood by those skilled in the art that various changes and modification may be made without departing from the spirit and scope of the invention as defined in the following claims.

Accordingly, the thought of the present invention must not be confined to the explained embodiments, and the following patent claims as well as everything including variants equal or equivalent to the patent claims pertain to the category of the thought of the present invention.

What is claimed:

1. A method for providing a telematics service by using a virtual vehicle, comprising steps of:
    (a) a telematics server, responsive to receiving a request for registering the virtual vehicle from a third-party service-providing system that provides a third-party service linked with the telematics service, creating a virtual vehicle identifier (ID) corresponding to the virtual vehicle, and providing a telematics application programming interface (API) corresponding to the virtual vehicle to the third-party service-providing system;
    (b) the telematics server, responsive to receiving a link establishing request from the third-party service-providing system, creating a token ID corresponding to the third-party service-providing system by referring to information on the third-party service-providing system and the virtual vehicle ID, and transmitting the token ID to the third-party service-providing system;

(c) the telematics server, responsive to receiving a telematics service request making use of a received token ID from at least one telematics API, confirming a vehicle ID corresponding to the received token ID among registered vehicle IDs, and confirming whether the vehicle ID is an actual vehicle ID corresponding to an actual vehicle or the virtual vehicle ID corresponding to the virtual vehicle; and (d) the telematics server, (i) responsive to confirming that the vehicle ID is the actual vehicle ID, transmitting an API executing command signal corresponding to the telematics service request to a telematics device placed in the actual vehicle, and (ii) responsive to confirming that the vehicle ID is the virtual vehicle ID, converting the telematics service request into a simulation command signal, simulating the virtual vehicle by executing a simulation script corresponding to the converted simulation command signal, converting information on the result of the simulation into information on a result of providing the telematics service, and transmitting the information on a result of providing the telematics service to the third-party service-providing system.

2. The method of claim 1, wherein, before the simulation script is executed, the telematics server confirms a latest status of the virtual vehicle from information on the registered virtual vehicle corresponding to the virtual vehicle ID, executes the simulation script by using the virtual vehicle with the confirmed latest status, and updates a status of the virtual vehicle by registering information on the result of the simulation with information on the virtual vehicle.

3. The method of claim 1, wherein the third-party service-providing system includes a third-party server that provides the third-party service and a user device that uses the third-party service by linking with the third-party server; wherein, at the step of (a), the telematics server acquires the request for registering the virtual vehicle from the user device or the third-party server; and wherein, at the step of (b), the telematics server creates the token ID by referring to information on a user who uses the user device, and the virtual vehicle ID.

4. The method of claim 3, wherein the third-party service-providing system further includes a third-party unit that provides the third-party service to the user by linking with the third-party server; and wherein, if a request for registering the third-party unit is acquired from the user device or the third-party server, the telematics server registers and manages the third-party unit to be corresponding to the user's information and the virtual vehicle ID.

5. The method of claim 4, wherein the telematics server limits a number of the third-party units to be registered to a pre-specified value, and acquires and manages location information of the respective registered third-party units.

6. A telematics server for providing a telematics service by using a virtual vehicle, comprising:

a communication part acquiring a request for registering the virtual vehicle from a third-party service-providing system that provides a third-party service linked with the telematics service; and a processor creating a virtual vehicle identifier (ID) corresponding to the virtual vehicle, providing a telematics application programming interface (API) corresponding to the virtual vehicle to the third-party service-providing system, creating a token ID corresponding to the third-party service-providing system in response to the request for registering the virtual vehicle by referring to information on the third-party service-providing system and the virtual vehicle ID, transmitting the token ID to the third-party service-providing system, confirming a vehicle ID corresponding to the received token ID among registered vehicle IDs in response to the telematics service request corresponding to a telematics service request making use of a received token ID from at least one telematics API, confirming whether the vehicle ID is an actual vehicle ID corresponding to an actual vehicle or the virtual vehicle ID corresponding to the virtual vehicle, (i) responsive to confirming that the vehicle ID is the actual vehicle ID, transmitting an API executing command signal corresponding to the telematics service request to a telematics device placed in the actual vehicle, and (ii) responsive to confirming that the vehicle ID is the virtual vehicle ID, converting the telematics service request into a simulation command signal, simulating the virtual vehicle by executing a simulation script corresponding to the converted simulation command signal, converting information on the result of the simulation into information on a result of providing the telematics service, and transmitting the information on a result of providing the telematics service to the third-party service-providing system.

7. The telematics server of claim 6, wherein, before executing the situation script, the processor confirms a latest status of the virtual vehicle from information on the registered virtual vehicle corresponding to the virtual vehicle ID, executes the simulation script by using the virtual vehicle with the confirmed latest status, and updates a status of the virtual vehicle by registering information on the result of the simulation with information on the virtual vehicle.

8. The telematics server of claim 6, wherein the third-party service-providing system includes a third-party server that provides the third-party service and a user device that uses the third-party service by linking with the third-party server; and wherein the processor acquires the request for registering the virtual vehicle from the user device or the third-party server and creates the token ID by referring to information on a user who uses the user device, and the virtual vehicle ID.

9. The telematics server of claim 8, wherein the third-party service-providing system further includes a third-party unit that provides the third-party service to the user by linking with the third-party server; and wherein, if a request for registering the third-party unit is acquired from the user device or the third-party server, the processor registers and manages the third-party unit to be corresponding to the user's information and the virtual vehicle ID.

10. The telematics server of claim 9, wherein the processor limits a number of the third-party units to be registered to a pre-specified value and acquires, and manages location information of the respective registered third-party units.

* * * * *